United States Patent [19]
Buus

[11] Patent Number: 6,025,867
[45] Date of Patent: Feb. 15, 2000

[54] METHOD AND A DEVICE FOR RETAINING A THIN MEDIUM BETWEEN TWO BODIES

[75] Inventor: Niels Buus, Lystrup, Denmark

[73] Assignee: Dicon A/S, Lystrup, Denmark

[21] Appl. No.: 08/879,681

[22] Filed: Jun. 24, 1997

Related U.S. Application Data

[63] Continuation of application No. 08/343,480, Nov. 28, 1994, abandoned.

[30] Foreign Application Priority Data

May 26, 1992 [DK] Denmark ................................. 0694/92

[51] Int. Cl.[7] ............................. B41J 2/435; G01D 15/24; H01S 1/131; G11B 7/00
[52] U.S. Cl. ............................................................. 347/262
[58] Field of Search ..................................... 347/236, 259, 347/262, 241, 244, 263; 358/491; 342/264; 346/136

[56] References Cited

U.S. PATENT DOCUMENTS 4,032,927  6/1977  Goshima .

*Primary Examiner*—John Barlow
*Assistant Examiner*—Raquel Yvette Gordon
*Attorney, Agent, or Firm*—Kane, Dalsimer Sullivan and Levy, LLP

[57] ABSTRACT

A medium is retained in the predetermined mutual spaced relation in a gap between two plane faces on respective bodies. The bodies are mutually displaceable in a direction substantially perpendicular to the gap and biassed in the direction of displacement. One of the bodies is connected with a compressed air source providing through a plurality of outlets in the plane face of the respective body an air cushion between the face and the medium.

8 Claims, 6 Drawing Sheets

METHOD AND A DEVICE FOR RETAINING A THIN MEDIUM BETWEEN TWO BODIES

This application is a continuation of application Ser. No. 08/343,480, filed Nov. 28, 1994, now abandoned.

The invention concerns a method and a device for retaining a thin medium in a predetermined spaced relation in a gap between two bodies.

In recent years there has been a tremendous development in the printing industry, since a considerable part of the image processing is now performed by means of a computer. For example in offset printing the image information stored in a computer is transferred to a standard offset plate which is then used in a generally known printing unit which prints the desired number of copies. Since the image information is stored in the store of a computer, it is desirable to transfer the digitized data to the photosensitive medium, which may e.g. be a standard offset plate, photosensitive paper or film, and the transmission is to be performed with the best possible resolution.

Originally, the medium was illuminated through a partly transparent original containing the desired information. Since the processes are now computerized, use has so far been made of a laser beam which scans the medium for exposure, while the laser beam is modulated for the medium to obtain the correct illumination in all points. The information on the illumination pattern of the medium is now contained in a central control unit and is used for modulating the laser. For a satisfactory image quality to be obtained on the medium, the mechanical system retaining the original and the light source with respect to each other during exposure must satisfy strict stability requirements. For the required accuracy to be obtained, the medium for exposure is often arranged in a device of the type usually called "Internal Laser Image Drum Plotter". Devices of this type are described i.a. in U.S. Pat. Nos. 4,852,709, 4,595,957 and 3,958,250. Devices of this type provide a satisfactory image quality, but they have a very complex mechanical structure, because the light source and the medium are to be moved very accurately with respect to each other. Consequently, devices of this type have a relatively high cost price, which puts a limit to the number of users.

With a view to faster and better exposure of the medium, electronic chips have been developed by means of which a plurality of selectively modulatable light channels can be formed. These chips may be used for building a rod transversely to the medium for exposure, so that the medium is illuminated in a coherent line in its entire width. This type of equipment is known e.g. from U.S. Pat. No. 4,899,222, U.S. Pat. No. 5,030,970 and GB 2 187 855. It is common to these techniques that it is desirable to retain the medium at a very exact distance from the outlets of the illumination channels. The object of the invention is therefore to provide a method for retaining a medium, e.g. in the form of a thin plate, a sheet or the like at a predetermined spaced relation in a gap between two faces on their respective bodies, making it possible to control the distance between the medium and at least a portion of the face of one body. The invention is preferably to be used in connection with small distances, in particular below 1 mm.

This object is achieved as stated in the characterizing portion of claim 1, since the air cushion formed between the medium and at least one body ensures that the medium will only be subjected to very small mechanical stresses if it is moved in the gap. Further, it will be possible to vary the thickness of the air cushion by controlling the source of compressed air and/or the bias between the bodies.

The invention also concerns a device which, as stated in claim 2, is adapted to retain a thin medium in a predetermined spaced relation in a gap between two faces on respective bodies. The bodies are mutually displaceable in a direction substantially transversely to the gap and are biassed in the direction of displacement, so that the bodies press against each other. At least one of the bodies is connected with a source of compressed air having a plurality of outlets on the face of the respective body, thereby forming a compressed air cushion between the face and the medium. The distance between the medium and the surface of the body can be controlled by regulating the pressure of the compressed air.

In a preferred embodiment of the invention, the invention, as stated in claim 3, may be used in an exposure process using proximity focusing in the exposure of the medium, e.g. the medium exposed with the light is spaced very closely from an aperture or a pinhole causing diffraction of the light. It is a relatively undescribed physical effect which is employed. When collimated light enters an aperture, the light is diffracted, forming, after the aperture, a cone of light having an aperture angle determined by the wavelength of the light and the width of the aperture. This zone in which the light diverges is usually called the Fraunhofer field or region. However, the divergence of the cone of light only begins at a certain distance from the aperture, since the bundle of rays converges beforehand. The zone in which the bundle of rays converges is called the Fresnel field or region. When the bundle of rays leaves the aperture, it has a narrowing at a certain distance from the aperture. This distance depends on the diameter $2R$ of the aperture, the wavelength $\lambda$ of the light and on the thickness of the wall in which the aperture is provided. If the wall thickness is negligable, e.g. a vaporized layer on a crystal, the distance to the narrowing may be expressed by $R^2/\lambda$.

Claim 2 defines an apparatus in which proximity exposure principles according to the method defined in claim 1 are used.

On the face of it, one would believe that by diffraction the light is spread too much for the bundle of rays to be used as a well-defined beam for exposure of points on a medium, but it has surprisingly been found that such a bundle of rays in the region around its narrowing can be used for this purpose. A satisfactory depth definition can be obtained by arranging the medium for exposure in the vinicity of the narrowing of the bundle of rays, provided that the cross-sectional area of the bundle of rays at the location in question is not e.g. twice as large as its smallest cross-sectional area in the narrowing.

In case of light in the visible region the wavelength, e.g. for an Argon laser, will be about 488 nm. An aperture diameter of 5–10 $\mu$m for circular apertures will give a distance between the wall in which the aperture is provided and the narrowing of the cone of light of the order of 50–200 $\mu$m. The dot size in the narrowing of the bundle of rays will preferably be of the same order as the aperture, and in this case about 10 $\mu$m or less.

Claim 4 defines how a body on a face carrying the medium may advantageously be coated with a resilient material, such as foamed plastics or another flexible material. The air cushion will hereby press the medium down into the resilient material. This will be expedient in particular when the device is used for retaining a medium for proximity exposure, the distance between the medium and the outlet aperture of the illumination channels typically being of the order of 50 $\mu$m. Small variations in the surface of the device carrying the exposure device can hereby be compensated with the flexible material. Thus, it is permissible that the surface varies in the same order as the distance between the medium and the exposure device.

Claim 5 concerns an embodiment in which the body forming an engagement face for the medium is arranged on rails and serves as a carriage so that the medium is run past the exposure device.

Claim 6 states that the two bodies are arranged substantially stationarily, so that the only displacement taking place is compensation movements to maintain a constant thickness of the air cushion. Here there will thus be a transport mechanism for the medium when this is passed through the gap.

Claim 7 states how one body may be suspended freely so that the bias is provided by the gravity acting on it. As stated in claim 8, the principle can also be used in a drum, the medium being then arranged externally on the drum. The medium is retained by means of a source of vacuum connected with the first body so that the medium follows the rotation of the drum. The vacuum system for the drum can be controlled selectively, so that the medium is released when it leaves the drum housing.

The invention will be explained more fully below in connection with preferred embodiments and with reference to the drawing, in which FIG. 1 shows the principles of proximity exposure;

FIG. 2 schematically shows an illumination channel in the device for selective illumination of points on a medium;

FIG. 3 shows an enlarged view of a plurality of channel outlets on a unit in an apparatus for selective illumination of points on a medium;

FIG. 4 schematically shows the coupling of a light source to a channel forming unit;

FIG. 5 schematically shows a traction system for use in a device according to the invention;

FIG. 6 schematically shows the traction system of FIG. 5 together with the apparatus for selective illumination of points on a medium;

Figure 1:
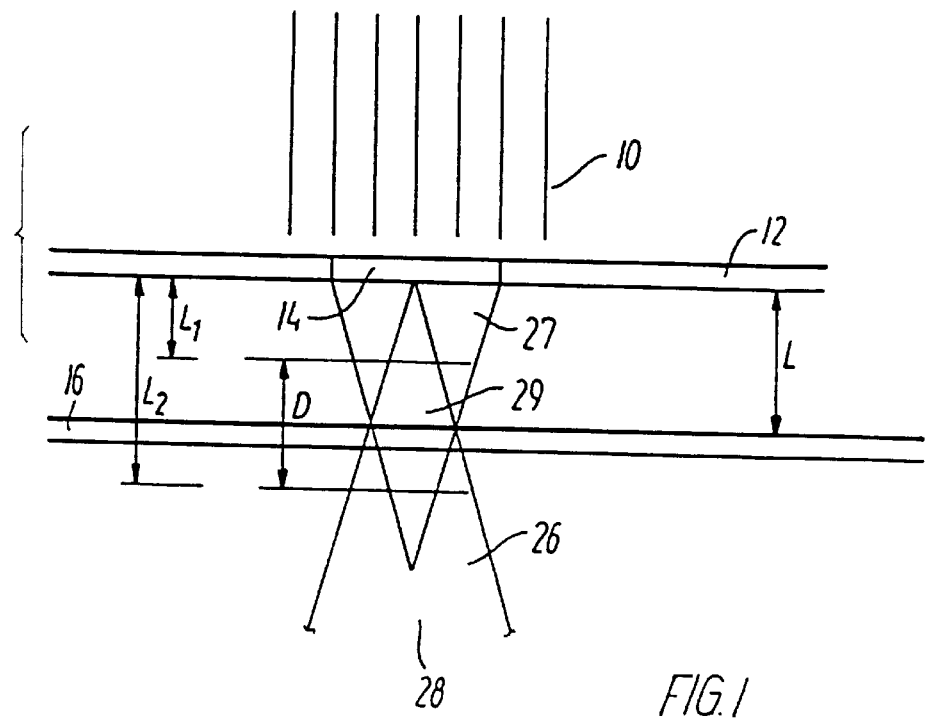

FIG. 1 illustrates the exposure principles of the invention. A collimated bundle of rays 10 is emitted toward a wall 12 having a pinhole 14. The bundle of rays is shown as parallel rays owing to the understanding of the geometry, but in practice this will be an approximation, because it is difficult to obtain, and in some cases not even desirable to use a collimated bundle of rays. When collimated light passes a pinhole 14 or an aperture having a small cross-section, the transmitted optical energy is provided by diffraction to a considerable extent. For reasons understandable by a skilled person, the transmitted light, when the wall 12 formed with a pinhole 14 is very thin, forms a bundle of rays 28, which first converges in a Fresnel region 27 and then diverges in a Fraunhofer region 26. In the transition between these two regions 26, 27 the bundle of rays has a narrowing 29 where it has the smallest cross-section. Where the incident bundle of rays is not collimated, but has non-plane wave fronts, the bundle of rays 28 will assume more complex geometries, which will be well-known to a skilled person, and which will not be necessary in this connection for the understanding of the invention. The geometry will likewise be changed, if the pinhole 14 assumes other shapes than a circular one.

The wall 12 preferably has a thickness of the same order as the wavelength $\lambda$ of the light, or less. This can be realized if the wall 12 is provided by evaporation on a substrate. The pinhole 14 can subsequently be removed by etching. In the preferred embodiment, the shown structure is integrated in a chip.

In the shown geometry the narrowing of the bundle of rays 28 is positioned at a distance L from the wall 12, the distance L being expressed by:

$$L=R^2/\lambda,$$

where R is the radius of the pin hole 14, while $\lambda$ is the wavelength of the light. If the light source is an Argon aser, the wavelength will be $\lambda=488$ nm. For a circular pinhole 14 having a radius of 8 $\mu$m the optimum exposure distance will be about 30 $\mu$m. It is usually preferred that the exposure distance L is in the range between 20 and 200 $\mu$m. The narrowing of the bundle of rays will then have a largest diameter of 6–10 $\mu$m. In case of other sources of light the physical parameters are selected in response to the wavelength. Owing to the exposure quality it will be necessary that the distance between the medium 16 and the wall 12 just varies about the optimum distance L within quite narrow tolerances.

The distance may e.g. be permitted to vary between distances $L_1$ and $L_2$, where the bundle of rays 28 has a cross-sectional area which is smaller than twice the cross-sectional area at the narrowing 29 of the bundle of rays 28. Between these distances there will be a region D in which the exposure has a form of depth definition. More remote, the cone of light or the bundle of rays diverges with an angle determined by the hole size and the wavelength. With this principle the bundle of rays can be focused on the medium 16 without using imaging optical instruments after the pinhole 14, which will be a great constructional advantage. The principle outlined above is referred to as proximity focusing or exposure below.

Figure 2:
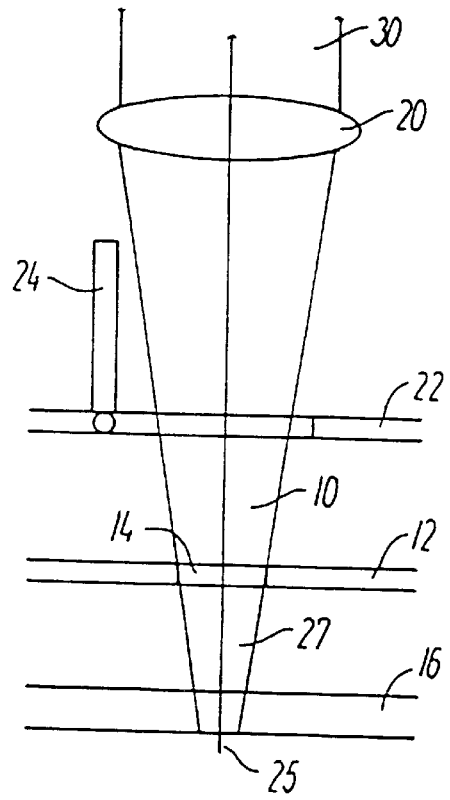

FIG. 2 shows an illumination channel according to the invention in which the proximity focusing technique illustrated in FIG. 1 is used. A light source (not shown) emits light 30 toward the inlet of the illumination channel in which a lens 20 is provided. The lens 20 is preferably a diffraction optical element (DOE) which has a width of the order of 50–100 $\mu$m. The lens 20 usually constitutes the limiting factor for the size of the smallest transverse dimension of a channel forming element that can be obtained. The lens 20 collects and amplifies the optical energy 30 as well as passes it on in the illumination channel in the form of the bundle of rays 10. The optical energy is transmitted from the lens 20 against a wall 22 having a valve or gate 24. The gate 24 is movable in the preferred embodiment, its movable part being coated with a metal layer so that the part adjusts itself to an electric field which is applied over the gate. Instead of containing movable parts, the gate may be stationary, and its reflection constant may be regulated by applying electric fields. The gate can hereby be either transparent or reflecting.

No matter how the function of the gate is provided, the gate 24 can be used for on/off modulating light radiation 10. As will be seen in FIG. 2, the bundle of rays 10 diverges, but, as will appear from the foregoing, this has no importance for the principle of the invention. Having passed the pinhole 14 in the wall 10, the bundle of rays hits the medium 16, as described above. The optical axis of the lens 20 is indicated by the reference numeral 25.

Figure 3:
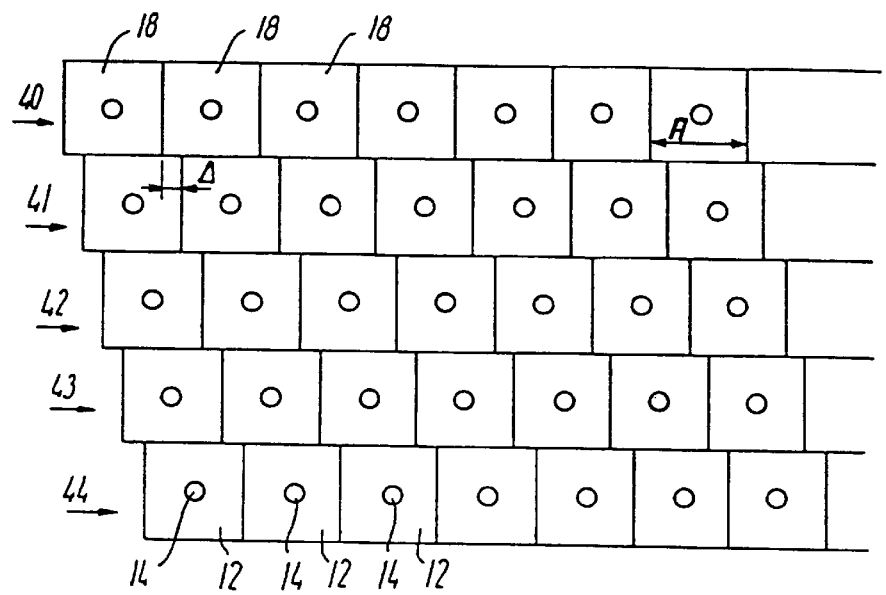

FIG. 3 shows a three-dimensional arrangement of channel forming units 18 according to the invention. Each of the units 18 has a wall 12 with a pinhole 14. FIG. 3 thus shows a large number of the channel forming units 18 of FIG. 2, seen from below. The units 18 are arranged in parallel rows 40–44. The units of two adjacent rows are offset at a distance Δ with respect to each other. As will be seen, the units 18 are preferably square, and they have a length A in the direction of the rows 40–44. To obtain an even distribution of the exposure points on the medium, the distance Δ, by which two units 18 in two adjacent rows are offset with respect to each other, is equal to the length A divided by the number N of parallel rows 40–44, which is 5 in this case, so that Δ=A/N =A/5. In the preferred embodiment Δ has the value 10 μm.

The rows 40–44 are implemented in a plurality of chips arranged transversely to the advancing direction of the medium, so that the rows extend perpendicularly to this direction. A line across the medium is thus exposed in that the row 40 is activated and emits modulated optical energy, while the other rows are passive. Every fifth point on the line is thus exposed. When the medium has been advanced a distance forwardly corresponding to the distance between the centers of the rows 40 and 41, the row 40 is activated so that points are exposed on the line of the medium at a distance Δ from the points already exposed. The medium 16 is thus exposed in that lines across the advancing direction of the medium are exposed point-wise by successive activation of the rows 40–44.

Figure 4:
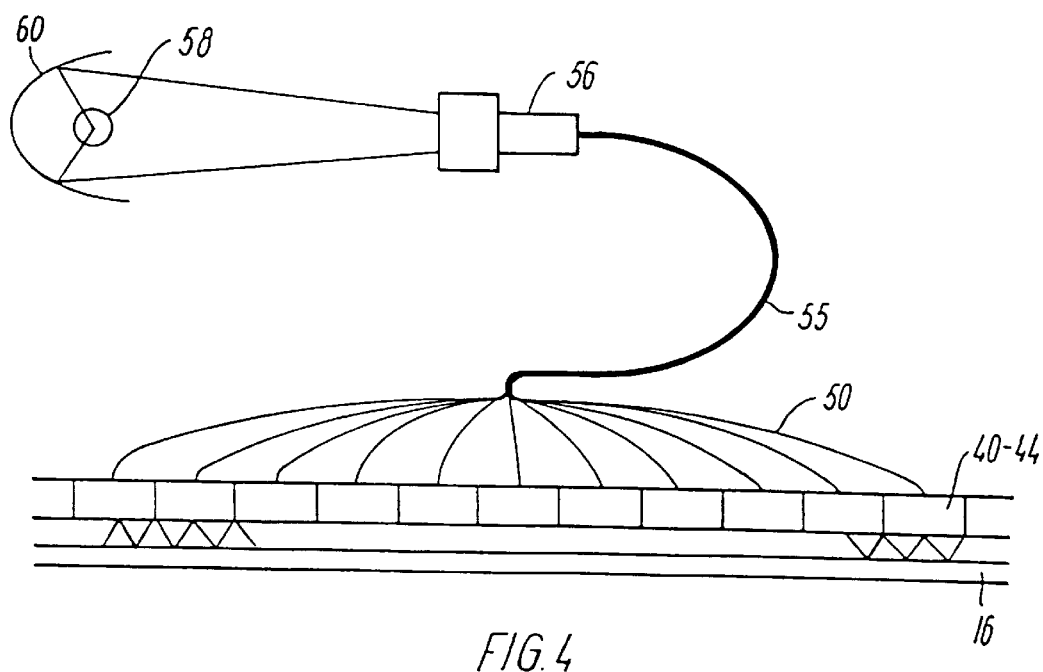

FIG. 4 shows an embodiment of how the illumination channels may be provided with optical energy. Optical energy from a light source 58 is coupled into a light conductor 55. Coupling takes place through a connector 56 having a suitable numerical aperture. A reflector 60 focuses the optical energy from the light source 58 on the input of the connector 56. The optical energy is transmitted from the light conductor 55 to the row 40–44 of chips via an area transforming light conductor 50, which transforms the light in the light conductor 55 to a narrow shaft of optical energy which is transmitted to the row 40–44. To obtain a suitably high level of optical energy, it is presently preferred to use a DC xenon lamp or a metal halide lamp; both of these lamps emit considerably more optical energy than a laser. Also other forms of light sources may be used depending upon the optical energy requirement. For example, it is possible to use a transversely pumped solid state laser whose cavity is formed by a glass rod. When the laser outlet is provided in the longitudinal direction of the rod, the light source and the chip row 40–44 can be arranged in quite close contact with each other.

With the light source outlined in FIG. 4, a relatively great power is needed, e.g. in the order of 1–4 kW, and the light source should therefore be positioned at a great distance from the exposure location. This, however, is no problem, since the light source 58 is coupled to the chip row 40–44 via the optical fibre or light conductor 55.

Figure 5:
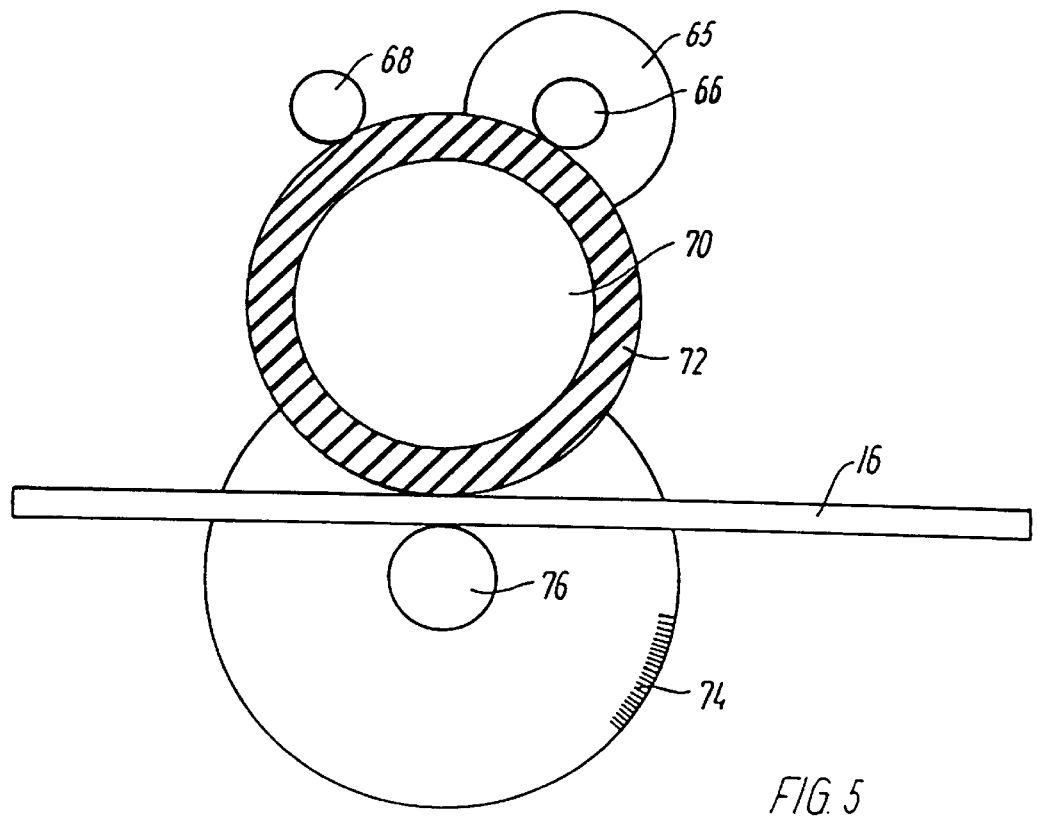

FIG. 5 shows a system for advancing the medium 16. In a preferred embodiment the medium 16 is moved past the exposure system by a transversal movement. This may e.g. be done by means of a traditional flat bed system. For economic reasons a sheet feed system is preferably used. The use of the latter system demands that the medium possesses some stiffness. This stiffness will be present when the system of the invention is used for recording standard offset plates, since these will often be of aluminium with an applied photosensitive emulsion. Other media include e.g. laser plates, film and photosensitive paper. However, the exposure system will also be useful in other connections than for exposure of printing blocks and the like, it being possible to use the exposure system described in connection with FIGS. 1–4 e.g. in the manufacture of wafers for integrated circuits.

The feed system shown in FIG. 5 is of the traction type so that the position of the medium can easily be read. The feed system comprises an electric motor 65 which has a drive wheel 66. The drive wheel 66, together with a rotatably mounted support wheel 68, frictionally engages a flexible friction wheel 70. The friction wheel 70 has a flexible rubber coating 72, by means of which a good mechanical contact with the medium 16 is obtained, without the feed system having to be adjusted each time a medium is replaced by another medium of a different thickness. The flexible friction wheel 70 presses the medium 16 against an idle wheel 76 on an encoder. The idle wheel 76 is secured to an encoder disc 74 which is peripherally provided with a row of radial marks which provide information on the position of the medium when the encoder disc 74 is transilluminated. This is an important item of information for the control unit for the exposure of the medium. The actual positional determination is prior art and will not be described more fully. A plurality of wheels is mentioned above, but a skilled person will appreciate that these wheels may either be formed by rollers transverse to the medium or by several juxtaposed wheels.

Figure 6:
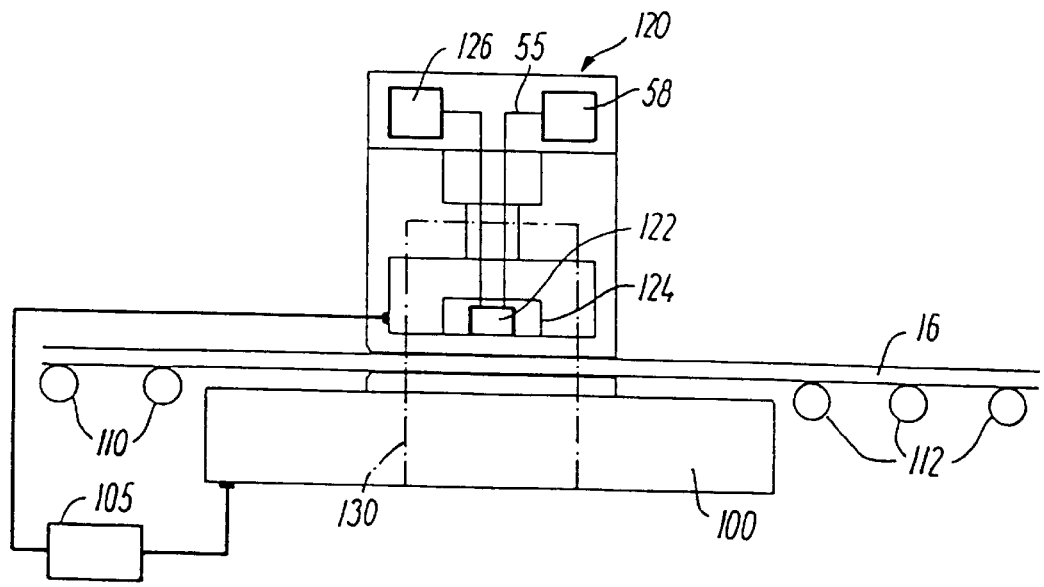

FIG. 6 schematically shows a preferred embodiment of an image recorder according to the invention. The recorder comprises two main parts—viz. a base part 100 and an exposure part 120. The base part 100 as well as the exposure part 120 are connected to a source 105 of compressed air. The exposure part 120 is arranged so as to be displaceable in a vertical direction above the base part 100. The exposure part 120 has a rod 124 transverse to the feed direction of the medium. A plurality of micromechanical chips of the type shown in FIG. 2 are arranged in the rod 124. The chips receive light from the light source 58 via a light conductor 55. A control unit 126 or a controller contains information on the illumination pattern with which the medium is to be exposed, and the control chips in response to this. The encoder system or traction system 140 is of the type shown in FIG. 5. The traction system 130 is arranged in connection with the chip rod 124 to obtain the best possible positional determination. The medium 16 is moved by means of a conveyor 110 into the gap between the base part 100 and the exposure part 120, and another conveyor 112 receives the medium 16 after the exposure. During the exposure the medium is advanced by means of the traction system.

Figure 7:
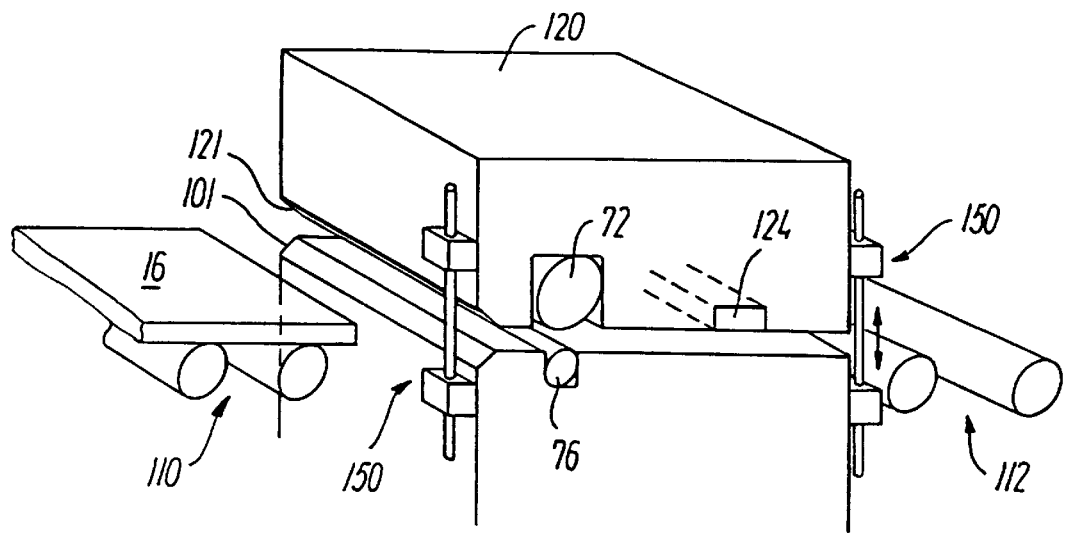
FIGS. 7–9 show selected details of the apparatus of FIG. 6.

FIG. 7 actually shows the same as FIG. 6, but it is indicated here that there is also a plurality of mechanical guides 150 permitting the base part 100 and the exposure part 120 to move with respect to each other, but only in a direction perpendicular to the medium. The distance between the bodies can hereby be regulated by means of the compressed air source 105 by regulating the added air pressure.

Figure 8:
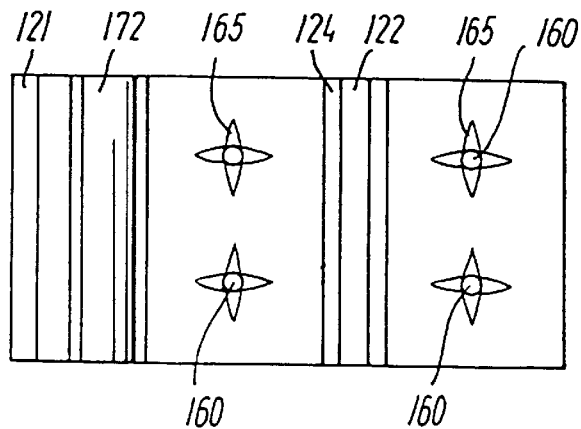

FIG. 8 shows the face of the exposure part 120 facing the medium 16, where the friction wheel 72 is visible. The exposure part 120 has an inclined front edge 121 which, together with a corresponding inclined front edge 101 on the base part 100, serves as funnel-shaped guide faces for the medium 16. The rod 124, in which a plurality of chips 122 are fixed, is seen across the exposure face of the exposure part 120. The face is moreover provided with a plurality of compressed air nozzles 160 with protruding depressions 165 in the face. The compressed air is distributed uniformly hereby, and an air cushion is provided between the face of the base part and the face of the exposure part, both of said faces being preferably provided with compressed air nozzles 160. When the medium is fed between the base part 100 and the exposure part 120, air cushions are formed on both sides of the medium 16, and it can be fed forwardly practically without friction. Further, the distance between the medium 16 and the face in which the rod 124 is arranged, is well-defined, the distance depending solely on the mass of the exposure part 120 and the pressure of the compressed air from the nozzles 160.

Figure 9:
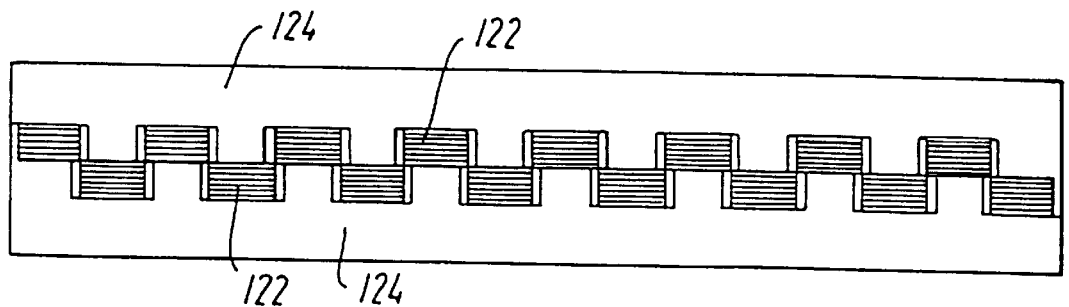

FIG. 9 shows the rod 124 with the chips 122. These are offset with respect to each other to ensure even exposure in the entire width of the rod. Each chip 122 can contain up to about 1000 illumination channels of the type shown in FIG. 2, said illumination channels being arranged in rows as shown in FIG. 3.

Figure 10:
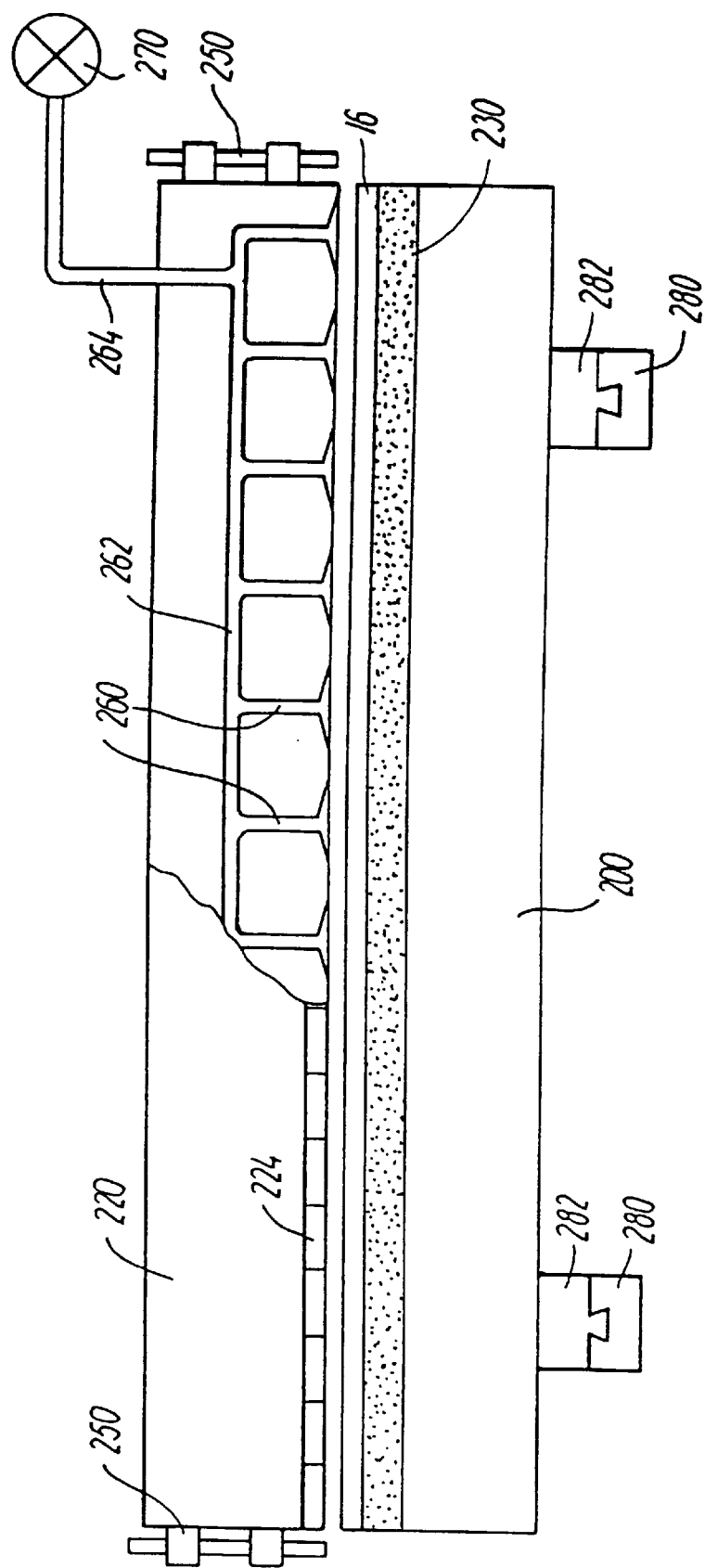
FIG. 10 shows an alternative embodiment of the retention device according to the invention.

FIG. 10 shows an alternative embodiment of the exposure device of the invention, said exposure device 220 being shown in a particular, partial section such that both the exposure device and the compressed air part are visible. The exposure part 220 is connected with an external compressed air source 270 which communicates via an external piping arrangement 264 with a pipe system 262, which is located internally in the exposure device 220 and conveys the compressed air down to nozzles or compressed air outlets 260. It will also be seen that an exposure rod 224, which may e.g. be constructed as shown in FIG. 9, is provided in the bottom of the exposure part 220. The exposure part 220 is connected with some vertical rails by means of a plurality of mechanical guides, said arrangement being designated by the reference numeral 250, whereby the exposure part 220 is allowed to move in a vertical direction. The device has a base part 200, which has two sets of feet 282 resting on two horizontal rails 280. The base part 200 can hereby be moved along the rails 280. A flexible bed 230 is provided on the base part 200, and this bed may e.g. be foamed plastics or another resilient material on which the medium 16 for exposure is placed. When the medium is exposed, the base part 200 serves as a flat bed arrangement so that the base part 200 as a carriage passes the exposure device 224, said device being controlled as mentioned in connection with the figures discussed previously. When proximity exposure is used in a preferred embodiment, the distance between the medium and the exposure device 224 will be of the order of 50–100 $\mu$m. It is usually an extremely difficult task to maintain this distance in the entire width of the medium, if the medium has a width of some size. A stable air cushion of the order of 50 $\mu$m can be established with the air cushion arrangement, and the use of a flexible bed 230 ensures that small surface variations along the exposure part do not entail variations in the air cushion thickness. The flexible bed 230 permits a reduction in the tolerance requirements with respect to the surface of the exposure part, since a surface variation of the same order as the air cushion thickness or larger can be absorbed by the flexible layer. If the flexible layer 230 was not present, the surface variations of the exposure part 220 would have to be made small with respect to the air cushion thickness.

Figure 11:
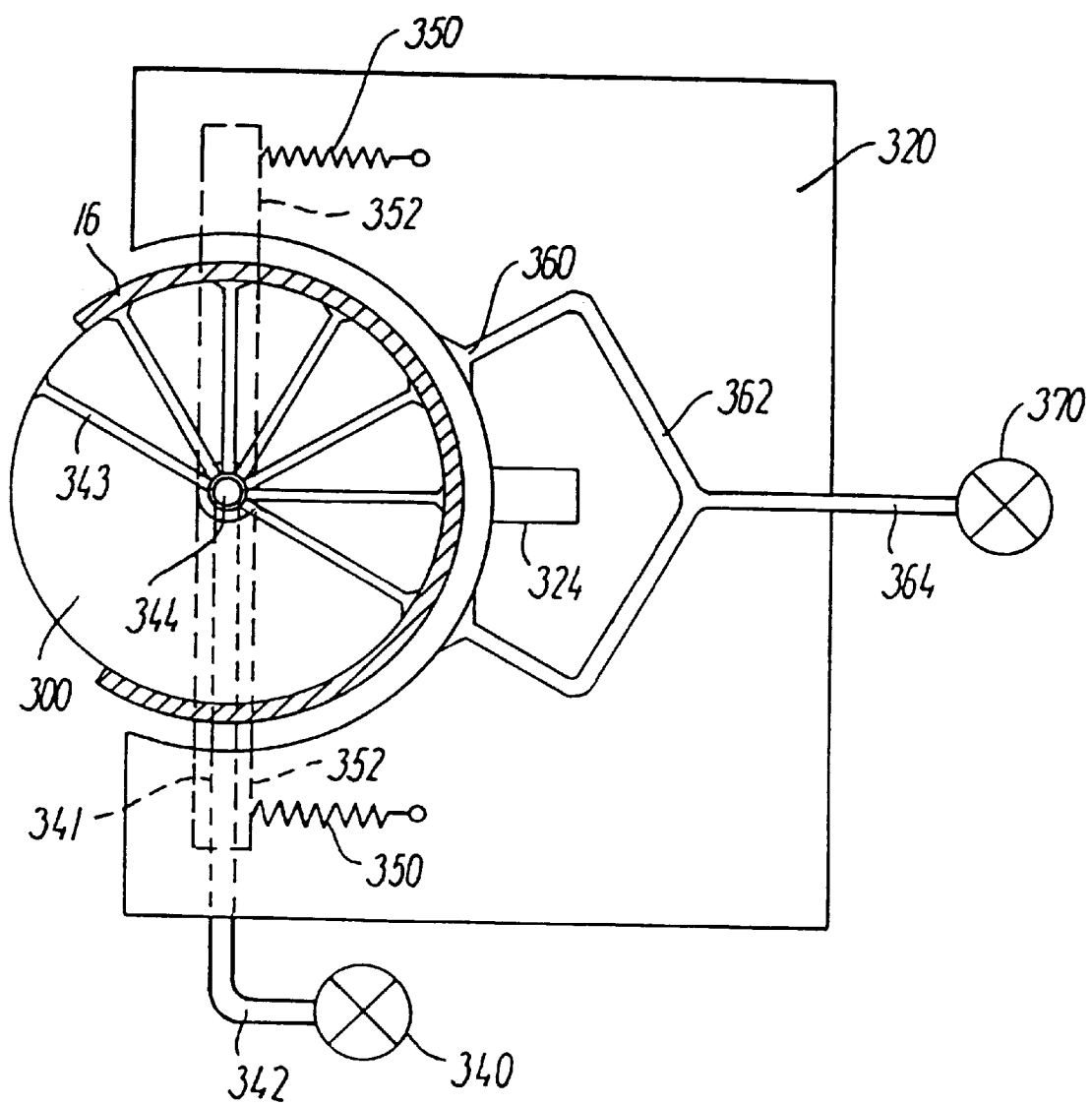
FIG. 11 shows a further alternative embodiment of the device of the invention.

FIG. 11 shows a corresponding arrangement, which here comprises a medium retention part 300 having the shape of a drum. This principle largely corresponds to what is known from exposure systems of the external drum type, and only the differences will therefore be explained. The retention part 300 is adapted to retain a medium 16, which takes place by means of a vacuum system having a plurality of suction holes 343. These suction holes are arranged evenly distributed along the periphery of the drum. The suction holes communicate with a central passage 344, which communicates with an external source of vacuum through a connection conduit 341 and an external connection conduit 342.

The exposure part 320 forms a housing for the cylindrical base or retention part 300. An exposure device 324 of the type discussed in connection with the preceding figures is arranged in the bottom of the housing. The face directed toward the medium 16 is formed with a plurality of compressed air nozzles 360, which are connected with a compressed air source 370 via an internal compressed air system 362 and an external compressed air tube 364. The drum 300, as is the case here, may be suspended from a beam 352 which is guided by a plurality of guides (not shown), such that the drum 300 and the exposure part 320 may be displaced in a direction in the plane formed by the central axis of the drum 300 and the exposure device 324. The distance between the exposure device 324 and the medium can be controlled very exactly with this system. The beam 352 is secured to the exposure part 320 via two spring devices 350. These are tension springs here, but a skilled person will appreciate that the tension springs can be replaced by compression springs or a pneumatic system or the like which will be capable of subjecting the drum 300 to a mechanical bias directed against the exposure device 324.

The exposure takes place in that the medium 16 is retained to the drum by means of the suction through the suction holes 343 generated by the vacuum source 340. As the drum 300 rotates, the medium 16 is illuminated in a line in its transverse direction. A skilled person will appreciate that the suction holes 343 can be controlled individually, since the medium 16 can then be retained in the area around the exposure device, but be released as it leaves the housing formed by the exposure device 320.

A skilled person will likewise understand that the expression "compressed air sources" is not restricted to atmospheric air under pressure alone, but can also comprise other forms of gases, it being essential to the invention that an air cushion or a gas cushion can be established between the exposure device and the medium. Thus, the compressed air source may be in the form of an ordinary pump, but can also comprise pressure cylinders and the like containing gas types useful for the purpose.

A skilled person will likewise appreciate that it is important to maintain a constant or substantially constant distance between the medium and the exposure device, and that it will therefore normally be expedient to incorporate a distance meter in the device, and such a distance meter may e.g. be an interferometer, it being possible to determine the distance very accurately by optical means here. This is not described above, because it will be trivial to a skilled person to incorporate such a system for the purpose concerned. Thus, such a distance meter makes it possible to regulate the pressure from the pressure source in response to the distance measured.

I claim:

1. A method for retaining a thin medium in a predetermined mutual spaced relation in a gap between a face on a first body and a face on a second body, comprising the steps of:

arranging said first body and said second body so as to be mutually displaceable in a direction substantially perpendicular to a portion of said gap where said spaced relation is to be maintained, biasing said first body and said second body in said direction of displaceability by subjecting at least one of said first body and said second body to a biasing force acting toward the other of said first body and said second body, forming an air cushion by directing an amount of air from a separate source of compressed air, said source of compressed air being independent of any speed of movement of said thin medium between said face of at least one of said first body and said second body and said thin medium, said at least one of said first body and said second body being connected with said separate source of compressed air and having a plurality of compressed air outlets in said face of said at least one of said first body and said second body for connection with said separate source of compressed air and establishing said air cushion and, regulating a thickness of said air cushion by varying at least one of the amount of air from said separate source of compressed air and said biasing force.

2. A device for retaining a thin medium in a predetermined spaced relation in a gap between a face of a first body and a face on a second body wherein said first body and said second body are mutually displaceable in a direction substantially perpendicular to at least a portion of said gap where said spaced relation is to be maintained, said device comprising:

a biasing means, extending a biasing force on at least one of said first body and said second body directed toward the other of said first body and said second body to bias said first body and said second body in said direction of displaceability;

a separate source of compressed air, said separate source of compressed air being independent of any speed of movement of said thin medium;

said at least one of said first body and said second body being connected with said separate source of compressed air and having one or more outlets in said face of said at least one of said first body and said second body connected with said separate source of compressed air whereby a flow of compressed air from said compressed air source may establish an air cushion between said face and said thin medium, and means for regulating a thickness of said air cushion by controlling at least one of the source of compressed air and the biasing means.

3. A device according to claim 2, wherein:
said thin medium is a photosensitive medium for exposure,
said first body serves as a support for said thin medium,
said second body is provided with an exposure device extending traversely to said thin medium, and
the distance between said thin medium and said exposure device is kept constant, while said exposure device is caused to illuminate said thin medium during mutual movement between said thin medium and said second body.

4. A device according to claim 2, wherein said first body is coated with a resilient material, such as foamed plastics, on said face directed toward said thin medium.

5. A device according to claim 3, wherein:
said first body has a plane engagement face for said thin medium, and
said first body is arranged on rails in parallel with said engagement face so as to be slidable along said rails while said thin medium is exposed by said exposure device of said second body while said second body is essentially retained.

6. A device according to claim 3, wherein:
said first body is essentially retained with respect to said second body during exposure, and p1 a feeding means is provided for feeding said thin medium between said first body and said second body.

7. A device according to claim 2, wherein:
said first body is a base member having a substantially plane face, and
said second body is suspended substantially freely above said base member and is biased by gravity.

8. A device according to claim 2, wherein said first body is a rotatable drum on which said thin medium is arranged externally and is retained by means of a vacuum from a source of vacuum so that said thin medium follows the rotation of said rotatable drum.

* * * * *

UNITED STATES PATENT AND TRADEMARK OFFICE
CERTIFICATE OF CORRECTION

PATENT NO.     : 6,025,867
DATED          : February 15, 2000
INVENTOR(S)    : Niels Buus Page 1 of 1

It is certified that error appears in the above-identified patent and that said Letters Patent is hereby corrected as shown below:

Upon review of the above captioned patent, patentee has noted that the international application data is missing from the title page of the patent.

Please correct the patent to read as follows:
After item [21] delete item [22] and replace with -- [22] PCT Filed: May 25, 1993
[86] PCT No.: PCT/DK93/00179
        371 Date: November 28, 2994
        102(e) Date: November 28, 1994

[87] PCT Pub.No.: WO 93/24326
    PCT Pub. Date: December 9, 1993--

Signed and Sealed this

Third Day of July, 2001

*Attest:*

NICHOLAS P. GODICI
*Attesting Officer*     *Acting Director of the United States Patent and Trademark Office*

UNITED STATES PATENT AND TRADEMARK OFFICE
CERTIFICATE OF CORRECTION

PATENT NO. : 6,025,867  
DATED : February 15, 2000  
INVENTOR(S) : Niels Buus

Page 1 of 1

It is certified that error appears in the above-identified patent and that said Letters Patent is hereby corrected as shown below:

Title page,  
Please correct the patent to read as follows:  
After item [21] delete item [22] and replace with -- [22] PCT Filed: May 25, 1993  
[86] PCT No.: PCT/DK93/00179  
        371 Date: November 28, 1994  
        102(e) Date: November 28, 1994

[87] PCT Pub.NO.: WO 93/24326  
    PCT Pub. Date: December 9, 1993 --

This certificate supersedes Certificate of Correction issued July 3, 2001.

Signed and Sealed this

Twenty-fifth Day of December, 2001

*Attest:*

*Attesting Officer*

JAMES E. ROGAN  
*Director of the United States Patent and Trademark Office*